United States Patent [19]

Matsuura et al.

[11] Patent Number: 5,527,621
[45] Date of Patent: Jun. 18, 1996

[54] METHOD FOR SURFACE TREATMENT OF POLYIMIDE RESIN MOLDED ARTICLES

[75] Inventors: Hidekazu Matsuura; Yasuo Miyadera, both of Shimodate, Japan

[73] Assignee: Hitachi Chemical Co., Ltd., Tokyo, Japan

[21] Appl. No.: 182,363

[22] Filed: Jan. 18, 1994

Related U.S. Application Data

[63] Continuation of Ser. No. 831,658, Feb. 7, 1992, abandoned, which is a continuation of Ser. No. 585,928, Sep. 21, 1990, abandoned, which is a continuation of Ser. No. 94,606, Sep. 9, 1987, abandoned.

[30] Foreign Application Priority Data

Sep. 9, 1986 [JP] Japan .................. 61-211849

[51] Int. Cl.$^6$ ........................................ B05D 5/10
[52] U.S. Cl. .................. 428/473.5; 427/207.1; 427/301; 427/316; 427/322; 427/370; 427/387; 156/320; 156/322; 156/331.5
[58] Field of Search .................. 427/316, 322, 427/370, 387, 207.1, 301; 428/473.5; 156/320, 322, 331.5

[56] References Cited

U.S. PATENT DOCUMENTS

| | | | |
|---|---|---|---|
| 3,822,175 | 7/1974 | Yuen | 428/225.1 |
| 4,628,003 | 12/1986 | Katz | 428/377 |
| 4,778,727 | 10/1988 | Tesoro et al. | 428/448 |
| 4,797,307 | 1/1989 | Kunimoto et al. | 422/386 |
| 4,842,948 | 6/1989 | Galgliani | 428/473.5 |

FOREIGN PATENT DOCUMENTS

| | | |
|---|---|---|
| 48315 | 3/1982 | European Pat. Off. |
| 52-036778 | 9/1977 | Japan. |

OTHER PUBLICATIONS

Polymer Science Technology, vol. 29, pp. 517–523, 1984.

*Primary Examiner*—Ralph H. Dean
*Attorney, Agent, or Firm*—Antonelli, Terry, Stout & Kraus

[57] ABSTRACT

The surface of a polyimide molded article such as polyimide film is treated with a solution containing a basic compound, further treated with a solution containing a silane coupling agent and then subjected to a heat treatment. This greatly improves the adhesiveness of the polyimide molded article surface to the polyimide adhesive layer formed thereon. This invention can be applied to the production of substrates for flexible wiring boards having a polyimide film/polyimide adhesive/copper foil structure.

10 Claims, No Drawings

METHOD FOR SURFACE TREATMENT OF POLYIMIDE RESIN MOLDED ARTICLES

This application is a continuation application of application Ser. No. 07/831,658, filed Feb. 7, 1992, now abandoned, which is a continuation application of application Ser. No. 585,928, filed Sep. 21, 1990, now abandoned, which is a continuation application of application Ser. No. 094,606, filed Sep. 9, 1987, now abandoned.

DETAILED DESCRIPTION OF THE INVENTION

1. Field of Industrial Utilization

This invention relates to a method for surface treatment of polyimide molded articles, more particularly to said surface treatment method which can provide a surface with an excellent adhesiveness to the polyimide adhesive layer.

2. Prior Art

Polyimide molded articles, especially polyimide films are widely used as electrical insulators. For example, flexible wiring boards are manufactured by bonding a polyimide film to a metallic foil such as copper foil by using an acrylic adhesive as for instance described in Japanese Patent Application Kokai (Laid-Open) No. 34640/75. Acrylic adhesives, however, are low in heat resistance, so that use of such acrylic adhesives fell short of making the best use of the innate heat resistance of polyimide film. For making good use of heat resistance of polyimide film, polyimide adhesives have been developed (see, for example, Japanese Patent Application Kokai (Laid-Open) No. 60755/86). It was found, however, that such polyimide adhesives had their own problems such that they require complicated and long-time drying since they generate water on ring closure, and that they are low in peel strength because of high modulus of elasticity. For improving adhesiveness of polyimide film to the polyimide adhesive layer, it has been attempted to mechanically roughen the polyimide film surface and to apply a plasma treatment (Japanese Patent Application Kokai (Laid-Open) No. 218789/84). However, mechanical toughening of the film surface can not provide a sufficient adhesiveness, while the plasma treatment, although capable of producing a certain effect, requires a costly apparatus and also has the problem that its effect lowers in a short time. A method is also known in which the polyimide film is first treated with an alkali and then further treated with a metallic salt having a lower ionization tendency than alkaline metals (Japanese Patent Publication No. 36778/77). This method has the drawbacks that a heavy metal is used, and that although this method is effective for certain specific types of polyimide adhesives, it produces no satisfactory effect for many other types of polyimide adhesives.

PROBLEMS TO BE SOLVED BY THE INVENTION

The present invention has for its object to eliminate said defects of the prior art and to provide a surface treatment method for polyimide molded articles which method is capable of providing a surface with a satisfactory adhesiveness to the polyimide adhesive layer by a simple operation and a simple apparatus.

MEANS FOR SOLVING THE PROBLEMS

The surface treatment method for polyimide molded articles according to this invention comprises first treating the surface of a polyimide molded article to be treated with a solution containing a basic compound, then further treating said surface with a solution containing a silane coupling agent, and then subjecting said surface to a heat treatment.

The polyimide molded articles that can be treated by the method of this invention include films, polyimide laminates, exposed portions of base films of flexible printed wiring boards, and other similar products with the exposed polyimide resin surfaces. The polyimide referred to in this invention includes polyamide-imide, polyether-imide, polyester-imide, and other similar resin materials having an imide structure.

Preferred examples of the basic compounds usable in this invention are alkaline metal hydroxides such as sodium hydroxide, potassium hydroxide, lithium hydroxide, etc., and quaternary ammonium hydroxides such as tetramethylammonium hydroxide, tetraethylammonium hydroxide, tetrabutylammonium hydroxide, etc., among which potassium hydroxide and sodium hydroxide are the most preferred.

As the solvent for dissolving said basic compound, water or an alcohol such as metanol, ethanol, propanol, isopropanol, etc., or a mixture of water and an alcohol is preferably used.

The concentration of the basic compound in the solution of said compound and the temperature and time for the surface treatment of polyimide molded articles are decided according to the desired degree of treatment and therefore not specified, but generally the concentration is preferably 0.1 to 50% by weight, the temperature is room temperature to 80° C., and the time is from 0.1 minute to one hour. The surface treatment of polyimide molded articles with a solution containing said basic compound can be accomplished by a known method such as immersing the polyimide molded article in said solution or cast coating by using an applicator, doctor knife or like means. After the treatment with said basic compound-containing solution, the article surface is further treated with a solution containing a silane coupling agent. Before conducting the latter treatment, a treatment with an acid solution such as hydrochloric acid, sulfuric acid or acetic acid solution may be performed.

The silane coupling agents usable in the method of this invention include vinylsilanes such as vinyltrimethoxysilane, epoxysilanes such as γ-glycidoxypropyltrimethoxysilane, mercaptosilanes such as γ-mercaptopropyltrimethoxysilane, and aminosilanes such as γ-aminopropyltriethoxysilane, N-phenyl-γ-aminopropyltrimethoxysilane, N-β(aminoethyl) γ-aminopropyltrimethoxysilane, N-β(aminoethyl) γ-aminopropylmethyldimethoxysilane, γ-ureidopropyltriethoxysilane, N-benzyl-γ-aminopropyltrimethoxysilane, aminoethylaminomethylphenetyltrimethoxsilane, p-aminophenyltrimethoxysilane, trimethoxysilylpropyldiethylenetriamine, 1-trimethoxysilyl-2-(aminomethyl)-phenylethane, etc. Among these silane coupling agents, mercaptosilanes and aminosilanes are preferred, and among them, γ-mercaptopropyltrimethoxysilane and γ-aminopropyltriethoxysilane are especially preferred.

The treatment with a solution containing a silane coupling agent is conducted after the treatment with a solution containing a basic compound. It can be accomplished by a known method, for example, by immersing a polyimide molded article in a solution of a silane coupling agent or by cast coating by using an applicator, doctor knife or like means.

As the solvent for dissolving the silane coupling agent, there can be used water, alcohols, acetone, ethyl acetate, toluene and other solvents which can dissolve the silane coupling agent used, but water, alcohols and acetone are preferred.

The concentration of silane coupling agent in the solution containing it is not specified in this invention, but usually a concentration of 0.01 to 30% by weight, especially 0.1 to 5% by weight is preferred. When the concentration is below 0.01% by weight, no satisfactory effect of the treatment with silane coupling agent is provided, while when the concentration exceeds 30% by weight, the effect also lowers. The treatment temperature and time are not subject to any specific limitations, but generally 0.5 to 10-minute immersion at room temperature suffices for the purpose of this invention.

The treatment with a silane coupling agent is followed by a heat treatment. This heat treatment is carried out under the temperature and time conditions that enable drying of the solvent in the solution of silane coupling agent and also allow advancement of the reaction between coupling agent and polyimide ring-opened functional group. Generally, this treatment is conducted at a temperature of 50° to 400° C. for 1 to 60 minutes, preferably at 70° to 300° C. for 3 to 45 minutes, more preferably at 90° to 120° C. for 5 to 30 minutes.

On the thus treated surface of a polyimide molded article are placed a sheet-like hot-melt polyimide adhesive and an adherend successively, and they are pressed and heated.

As the sheet-like hot-melt polyimide adhesive, there can be used a film of a polyimide resin alone or a glass fabric or aramide fabric impregnated with a polyimide resin. The "polyimide" referred to herein includes all types of resins having an imide structure such as polyamide-imide, polyester-imide, polyetherimide, etc., but the ones having a softening point below 400° C. are preferred.

The adherend may be of any type suited for the purpose, including polyimide molded articles, metal foils such as copper foil, aluminum foil, etc., and metal plates such as copper plate, iron plate, aluminum plate, stainless steel plate, 42 alloy plate, etc.

The bonding conditions vary according to the properties of the sheet-like adhesive used, but generally bonding is performed at a temperature higher than the softening point of the adhesive, preferably above the softening point of the adhesive and below the thermal decomposition starting temperature, under a pressure of 0.1 to 100 kg/cm$^2$. Any known suitable bonding method can be used. For instance, a desired adherend is placed on the adhesive layer and bonded by roll laminating or by a press or by pressing under heating in an autoclave.

Also, the treated surface of a polyimide molded article may be coated with a polyimide varnish or polyamide acid varnish and dried to form a heat-meltable adhesive layer.

The polyimide used for said polyimide varnish may be any resin having an imide structure such as polyamide-imide, polyester-imide, polyether-imide, etc., but the ones having a softening point below 400° C. are preferred.

The polyamide acid used for said polyamide acid varnish can be selected from all types of precursors of polyimides having an imide structure such as polyamideimide, polyester-imide, polyether-imide, etc., but the precursors of polyimides having a softening point below 400° C. are preferred.

The solvent for polyimide varnish or polyamide acid varnish used in this invention can also be any type which is capable of dissolving N-methylpyrrolidone, dyglime, and polyimide or polyamide acid, but high-melting point non-protonic polar solvents such as N,N-dimethylacetamide, N,N-dimethylformamide, N,N-diethylformamide, dimethyl sulfoxide, sulforan, methylsulforan, tetramethylurea, hexamethylphosphoramide, butyrolactone, etc., are preferred. These solvents may be used singly or in combination. It is also possible to add thereto other solvents such as xylene, toluene, benzene, phenol, acetone, methyl ethyl ketone, diacetone alcohol, cellosolve, methyl isobutyl ketone, cresol, dioxane, cyclohexanone, etc., in an amount range which won't cause precipitation of polyamide acid.

The concentration of polyimide or polyamide acid in the varnish is not specified, but a concentration of 5 to 40% by weight, preferably 10 to 30% by weight, is favorable for forming the adhesive coat.

For coating the surface treated polyimide molded article with a polyimide varnish or polyamide acid varnish, there can be used a known method such as immersing said article in a polyimide varnish or polyamide acid varnish or cast coating said article by using an applicator, doctor knife or like means.

The conditions for drying the polyimide varnish or polyamide acid varnish coated on the surface-treated polyimide molded article to form an adhesive layer can not be decided unequivocally as they are variable according to the type of the solvent used and also depending on whether the varnish is polyimide varnish or polyamide acid varnish, but generally such drying is conducted at a temperature of 50° to 400° C. for a period of 0.1 to 5 hours. In case the varnish used is an already ring-closed polyimide varnish, said drying is conducted at a temperature of 50° to 200° C. for a period of 0.1 to 1 hour to volatilize away the solvent. On the other hand, in case of using a polyamide acid varnish, as it is desirbale for dispensing with the drying step at the time of bonding that the polyamide acid be ring-opened and made into polyimide by the time when the adhesive layer is formed after drying, said drying is preferably conducted by heating at a temperature of 100° to 400° C. for a period of 0.1 to 5 hours for effecting said transformation into polyimide.

A desired adherend is placed on the adhesive layer side of the thus treated polyimide molded article and pressed and heated to obtain a laminate having a strong adhesion.

The adherend is not specified. For instance, it may be a polyimide molded article, a metal foil such as copper foil, aluminum foil, etc., or a metal plate such as copper plate, iron plate, aluminum plate, stainless steel plate, 42 alloy plate, etc.

The pressing and heating conditions vary according to the properties of the adhesive layer, but generally the operation is carried out at a temperature above the softening point of the adhesive used, preferably above the softening point of the adhesive used and below the thermal decomposition starting temperature, under a pressure of 0.1 to 100 kg/cm$^2$. The bonding method is not specified. For instance, bonding can be accomplished by placing a desired adherend to the adhesive layer and subjecting them to roll laminating or a press or by heating and pressing them in an autoclave.

EXAMPLE 1

KAPTON 200 H (a 50 μm thick polyimide film available from E. I. Du Pont de Neymours & Co.) was immersed in a 30% aqueous solution of potassium hydroxide at room temperature for 10 minutes and then washed with water. This film was then immersed in a 5% acetone solution of γ-mercaptopropyltrimethoxysilane at room temperature for 30 seconds, and then heat treated at 200° C. for 10 minutes and dried.

64.4 g of 3,3', 4,4'-benzophenonetetracarboxylic acid dianhydride, 12.2 g of m-toluylenediamine and 43.2 g of bis(4-(3-aminophenoxy)phenyl)sulfone were dissolved in 480 g of N-methylpyrrolidone, and after heating this solution at 180° C. for 6 hours, 11.3 g of N,N'-diphenyl-methanebismaleimide was further dissolved therein to form a varnish, and this varnish was cast onto a glass plate, dried at 80° C. for 10 minutes, peeled from the glass plate, set to an iron frame and dried at 200° C. for one hour to obtain a sheet-like polyimide adhesive. This sheet-like adhesive and a 34 μm thick one side-roughened copper foil were placed on the treated side of said surface-treated KAPTON film and pressed at 275° C. under a pressure of 50 kg/cm² for 30 minutes to obtain a copper-clad base plate. The 90° peel strength between KAPTON and polyimide adhesive film of said copper-clad base plate was 0.94 kg/cm. The results are shown in Table 1.

EXAMPLES 2–11 AND COMPARATIVE EXAMPLES 1–3

Copper-clad base plates were made in the same way as Example 1 by using the KAPTON films which had been treated similarly to Example 1 except for the conditions shown in Table 1, and the 90° peel strength between KAPTON and polyimide adhesive film of said base plates was measured. The results are shown in Table 1.

TABLE 1

| | | Items | | | |
|---|---|---|---|---|---|
| | KOH | Silane coupling agent | | | |
| No. | immersion time (min) | Name | Concentration (wt. %) | Drying temp. (°C.) | Peel strength (kg/cm) |
| Example 1 | 10 | S | 5 | 200 | 0.94 |
| Example 2 | 10 | A | 1 | 250 | 0.40 |
| Example 3 | 30 | A | 1 | 250 | 0.80 |
| Example 4 | 10 | A | 5 | 250 | 0.33 |
| Example 5 | 10 | A | 0.1 | 250 | 0.11 |
| Example 6 | 10 | A | 1 | 200 | 0.83 |
| Example 7 | 10 | A | 5 | 300 | 0.21 |
| Example 8 | 5 | A | 1 | 250 | 0.35 |
| Example 9 | 10 | S | 5 | 300 | 0.31 |
| Example 10 | 10 | S | 1 | 150 | 0.10 |
| Example 11 | 10 | A | 10 | 300 | 0.10 |
| Comp. Example 1 | — | — | — | 250 | 0.04 |
| Comp. Example 2 | 10 | — | — | 250 | 0.04 |
| Comp. Example 3 | — | A | 1 | 250 | 0.07 |

Silane coupling agent
A: γ-aminopropyltriethoxysilane
S: γ-mercaptopropyltrimethoxysilane

EXAMPLE 12–15

KAPTON 100 H was immersed in a 5% aqueous solution of sodium hydroxide at 50° C. for 20 minutes, then washed with water, further immersed in 5% hydrochloric acid for 5 minutes and washed with water. The thus treated film was immersed in 1% aqueous solutions of silane coupling agents shown in Table 2 at room temperature for one minute and then heat treated at 250° C. for 20 minutes and dried. Copper-clad base plates were made in the same way as Example 1 by using said surface-treated KAPTON films, and the 90° peel strength between KAPTON and polyimide adhesive film was measured. The results are shown in Table 2.

TABLE 2

| No. | Coupling agent | Peel strength (kg/cm) |
|---|---|---|
| Example 12 | B | 0.10 |
| Example 13 | C | 0.15 |
| Example 14 | D | 0.21 |
| Example 15 | E | 0.12 |

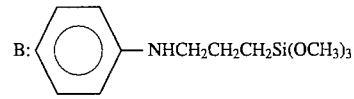

C: $H_2NCH_2CH_2NHCH_2CH_2CH_2Si(OCH_3)_3$
D: $H_2NCONHCH_2CH_2CH_2Si(OCH_2CH_3)_3$

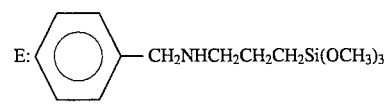

EXAMPLE 16

KAPTON 200 H was immersed in a 30% aqueous solution of potassium hydroxide at room temperature for 10 minutes and then washed with water. It was then immersed in a 1% acetone solution of γ-aminopropyltriethoxysilane at room temperature for 30 seconds and dried at 200° C. for 10 minutes.

64.4 g of 3,3',4,4'-benzophenonetetracarboxylic acid dianhydride, 12.2 g of m-toluylenediamine and 43.2 g of bis(4-(3-aminophenoxy)phenyl 1) sulfone were dissolved in 480 g of N-methylpyrrolidone, and after heating this solution at 180° C. for 6 hours, 11.3 g of N,N'-diphenyl-methanebismaleimide was dissolved therein to prepare a polyimide varnish. The polyimide concentration in this varnish was 20% by weight. This varnish was cast onto said surface treated KAPTON by using an applicator and dried at 80° C. for 10 minutes and then at 200° C. for 1.5 hours to form an adhesive layer. A 35 μm thick one side-roughened copper foil was placed on this adhesive layer and pressed at 275° C. under a pressure of 50 kg/cm² for 30 minutes to obtain a copper-clad base plate. The 90° C. peel strength between KAPTON and polyimide adhesive of said copper-clad base plate was 0.83 kg/cm.

COMPARATIVE EXAMPLE 4

A copper-clad base plate was obtained in the same way as Example 16 except that the γ-aminopropyltriethoxysilane solution was not used. The 90° peel strength between KAPTON and polyimide adhesive of this copper-clad base plate was only 0.04 kg/cm.

COMPARATIVE EXAMPLE 5

A copper-clad base plate was obtained in the same way as Example 16 except for use of a KAPTON film which had undergone no surface treatment. The 90° peel strength between KAPTON and polyimide adhesive of this copper-clad base plate was as low as 0.05 kg/cm.

EXAMPLE 17

KAPTON 200 H was immersed in a 30% aqueous solution of sodium hydroxide at room temperature for 30 minutes and then washed with water. It was then immersed in a 5% acetone solution of γ-mercaptopropyltrimethoxysilane for 30 seconds and dried at 250° C. for 10 minutes. On this surface treated KAPTON was formed an adhesive layer in the same way as in Example 16, and then another surface treated KAPTON was placed thereon and pressed at 275° C. under a pressure of 50 kg/cm$^2$ for 30 minutes to obtain a laminate. The 90° peel strength between KAPTON and polyimide adhesive of this laminate was 0.92 kg/cm.

EXAMPLE 18

Equimolecular amounts of ethylenebistrimellitate dianhydride and bis(4-(m-aminophenoxy)phenyl)sulfone were reacted in N-methylpyrrolidone at 180° C. for 6 hours to obtain a polyimide varnish. The concentration of this varnish was 20% by weight. An adhesive-backed KAPTON film was made by using said varnish after the manner of Example 16, and this film was placed on a 35 μm thick one side-roughened copper foil and pressed at 200° C. under a pressure of 30 kg/cm$^2$ for 30 minutes to make a copper-clad base plate. This copper-clad base plate had a 90° peel strength of 0.72 kg/cm between KAPTON and polyimide adhesive.

EXAMPLE 19

Equimolecular amounts of 3,3', 4,4'-benzophenonetetracarboxylic acid dianhydride and 3,3'-diaminodiphenyl ketone were mixed and stirred in dyglime at 15° C. for 24 hours while properly adding ethanol to obtain a polyamide acid varnish. This varnish had a concentration of 15% by weight. This varnish was cast onto a KAPTON film which had been surface treated in the manner of Example 1, by using an applicator and dried at 100° C. for 30 minutes and then at 220° C. for 60 minutes to form an adhesive layer. A 35 μm thick one side-roughened copper foil was placed on said adhesive layer and pressed at 330° C. under a pressure of 30 kg/cm$^2$ for 30 minutes to obtain a copper-clad base plate. The 90° peel strength between KAPTON and polyimide adhesive of this copper-clad base plate was 0.65 kg/cm.

EFFECT OF THE INVENTION

According to the method of this invention, it is possible to obtain polyimide molded articles having a surface with strong adhesiveness to polyimide adhesive layer without requiring complicated operations and costly apparatus. The invention therefore is of great industrial value.

What is claimed is:

1. A process for producing a polyimide molded article having a surface to which a polyimide adhesive is applied which comprises first treating the surface of the polyimide molded article with a solution containing a basic compound, then treating the surface with a solution containing a silane coupling agent, subsequently subjecting the treated surface to a heat treatment at a temperature of from 70° C. to 300° C. to provide a surface with excellent adhesiveness for a polyimide adhesive, and further applying the polyimide adhesive directly to the surface having excellent adhesiveness for a polyimide adhesive.

2. A process for producing a laminate including a surface of a polyimide molded article and a surface of an adherend adhered together with a polyimide adhesive which comprises first treating the surface of the polyimide molded article with a solution containing a basic compound, then treating the surface of the polyimide molded article with a solution containing a silane coupling agent, subsequently subjecting the treated surface to a heat treatment at a temperature of from 70° C. to 300° C. to provide a surface with excellent adhesiveness for a polyimide, further applying a polyimide adhesive and then applying an adherend successively, and thereafter bonding the adherend, the polyimide adhesive and the treated polyimide molded article by applying a pressure thereto at a temperature higher than the softening point of the adhesive.

3. A process according to claims 1 or 2, wherein the silane coupling agent is an amino silane coupling agent.

4. A process according to claim 3, wherein the amino silane coupling agent is γ-aminopropyltriethoxysilane.

5. A process according to claims 1 or 2, wherein the polyimide adhesive is a heat-meltable polyimide adhesive.

6. A process according to claims 1 or 2, wherein the adhesive is an adhesive formed into a sheet.

7. A process according to claim 1, wherein the process consists of first treating the surface of the polyimide molded article with a solution containing a basic compound, then treating the surface with the solution containing a silane coupling agent, subsequently subjecting the treated surface to the heat treatment and the step of further applying the polyimide adhesive directly to the surface having excellent adhesiveness for the polyimide adhesive.

8. A process according to claim 2, wherein the process consists of first treating the surface of the polyimide molded article with the solution containing a basic compound, then treating the surface with the solution containing the silane coupling agent, subsequently subjecting the treated surface to the heat treatment, further applying the polyimide adhesive and then applying the adherend successively, and thereafter bonding the adherend, the polyimide adhesive, and the treated polyimide molded article by applying pressure thereto.

9. A process according to claim 1, wherein the treated surface is subjected to a heat treatment at a temperature of from 150° C. to 250° C.

10. A process according to claim 2, wherein the treated surface is subjected to a heat treatment at a temperature of from 150° C. to 250° C.

* * * * *